United States Patent
Cooney, III et al.

(10) Patent No.: US 8,604,618 B2
(45) Date of Patent: Dec. 10, 2013

(54) STRUCTURE AND METHOD FOR REDUCING VERTICAL CRACK PROPAGATION

(75) Inventors: Edward C. Cooney, III, Jericho, VT (US); Jeffrey P. Gambino, Westford, VT (US); Zhong-Xiang He, Essex Junction, VT (US); Xiao Hu Liu, Briarcliff Manor, NY (US); Thomas L. McDevitt, Underhill, VT (US); Gary L. Milo, Williston, VT (US); William J. Murphy, North Ferrisburgh, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/239,533

(22) Filed: Sep. 22, 2011

(65) Prior Publication Data
US 2013/0075913 A1 Mar. 28, 2013

(51) Int. Cl.
*H01L 23/485* (2006.01)
*H01L 21/3205* (2006.01)

(52) U.S. Cl.
USPC ............. 257/759; 257/E23.145; 257/E23.17; 257/E29.001; 257/491; 257/618; 257/620; 257/629; 257/637; 257/669; 257/635; 257/782; 257/784

(58) Field of Classification Search
USPC ............... 257/759, 491, E23.145, E23.17, 257/E29.001, 618, 620, 629, 637, 669, 635, 257/782, 784
See application file for complete search history.

(56) References Cited

U.S. PATENT DOCUMENTS

| | | |
|---|---|---|
| 5,789,302 A | 8/1998 | Mitwalsky et al. |
| 6,022,791 A | 2/2000 | Cook et al. |
| 6,117,765 A | 9/2000 | Kim et al. |
| 6,214,719 B1 | 4/2001 | Nag |
| 6,261,945 B1 * | 7/2001 | Nye et al. ............... 438/633 |
| 6,465,895 B1 * | 10/2002 | Park et al. ............... 257/782 |
| 6,495,918 B1 | 12/2002 | Brintzinger |
| 6,815,813 B1 | 11/2004 | Dalton et al. |
| 6,838,355 B1 | 1/2005 | Stamper et al. |
| 7,138,329 B2 | 11/2006 | Lur et al. |
| 7,521,336 B2 | 4/2009 | Daubenspeck et al. |
| 7,544,602 B2 * | 6/2009 | Clevenger et al. ......... 438/619 |
| 7,649,258 B2 | 1/2010 | Usami et al. |

(Continued)

OTHER PUBLICATIONS

International Searching Authority PCT Search Report, PCT/US12/54548, International Business Machines Corporation, pp. 1-11, Dated Nov. 26, 2012.

*Primary Examiner* — A O Williams
(74) *Attorney, Agent, or Firm* — Gibb & Riley, LLC; Richard M. Kotulak, Esq.

(57) ABSTRACT

A semiconductor device and a method of fabricating the same, includes vertically stacked layers on an insulator. Each of the layers includes a first dielectric insulator portion, a first metal conductor embedded within the first dielectric insulator portion, a first nitride cap covering the first metal conductor, a second dielectric insulator portion, a second metal conductor embedded within the second dielectric insulator portion, and a second nitride cap covering the second metal conductor. The first and second metal conductors form first vertically stacked conductor layers and second vertically stacked conductor layers. The first vertically stacked conductor layers are proximate the second vertically stacked conductor layers, and at least one air gap is positioned between the first vertically stacked conductor layers and the second vertically stacked conductor layers. An upper semiconductor layer covers the first vertically stacked conductor layers, the air gap and the second plurality of vertically stacked conductor layers.

21 Claims, 10 Drawing Sheets

(56) References Cited

U.S. PATENT DOCUMENTS

| | | |
|---|---|---|
| 7,790,577 B2 | 9/2010 | Liu et al. |
| 7,871,902 B2 | 1/2011 | Kaltalioglu et al. |
| 7,955,952 B2 * | 6/2011 | Liu et al. .................. 438/462 |
| 2002/0158337 A1 | 10/2002 | Babich et al. |
| 2003/0183940 A1 * | 10/2003 | Noguchi et al. .............. 257/767 |
| 2006/0223242 A1 | 10/2006 | Daubenspeck et al. |
| 2006/0264035 A1 | 11/2006 | Nogami |
| 2006/0267208 A1 * | 11/2006 | Colburn et al. ............... 257/774 |
| 2007/0102792 A1 | 5/2007 | Wu |
| 2008/0237868 A1 | 10/2008 | Clevenger et al. |
| 2008/0297975 A1 * | 12/2008 | Gebreselasie et al. ........ 361/305 |
| 2009/0149013 A1 | 6/2009 | Daubenspeck et al. |
| 2010/0012950 A1 | 1/2010 | Liu et al. |
| 2010/0013043 A1 * | 1/2010 | Liu et al. ...................... 257/491 |
| 2010/0181651 A1 * | 7/2010 | Pan et al. ...................... 257/623 |
| 2010/0200960 A1 | 8/2010 | Angyal et al. |
| 2011/0074033 A1 * | 3/2011 | Kaltalioglu et al. .......... 257/758 |
| 2011/0291281 A1 * | 12/2011 | Huang et al. .................. 257/762 |
| 2013/0171817 A1 * | 7/2013 | Cooney et al. ................ 438/637 |

* cited by examiner

STRUCTURE AND METHOD FOR REDUCING VERTICAL CRACK PROPAGATION

BACKGROUND

The embodiments herein relate to a structure and a method to reduce vertical dielectric film crack propagation in semiconductor devices, and more specifically, to an internal crack stop design that utilizes an air gap, a series of air gaps and/or metal dummy fill shapes positioned between conductive metal wire stacks to prevent crack propagation in dielectric film between adjacent metal wire stacks.

SUMMARY

According to one embodiment, a semiconductor device includes an insulator and vertically stacked layers positioned on the insulator. Each of the vertically stacked layers includes a first dielectric insulator portion, a first metal conductor embedded within the first dielectric insulator portion, a first nitride cap covering the first metal conductor, a second dielectric insulator portion, a second metal conductor embedded within the second dielectric insulator portion and a second nitride cap covering the second metal conductor. The first vertically stacked conductor portion of the layers are proximate, or adjacent, the second vertically stacked conductor portion of the layers. An inter-stack material is positioned between the first vertically stacked conductor layers and the second vertically stacked conductor layers, and the inter-stack material includes at least one air gap.

According to another embodiment, a semiconductor device includes an insulator and layers on the insulator. Each of the layers includes a first metal conductor and a second metal conductor positioned proximate the first metal conductor. The first metal conductors include a first vertically stacked structure, and the second metal conductors include a second vertically stacked structure. At least one air gap is positioned between the first vertically stacked structure and the second vertically stacked structure.

According to another embodiment, a method of fabricating a semiconductor device includes forming an insulator, and potentially simultaneously forming a plurality of first vertically stacked metal layers and a plurality of second vertically stacked metal layers proximate (next to) each other. An inter-stack material is also formed between the first vertically stacked metal layers and the second vertically stacked metal layers. The inter-stack material is formed to include at least one air gap.

According to another embodiment a method of fabricating a semiconductor device includes forming an insulator, forming layers on the insulator. Each of the layers comprising a dielectric insulator portion, a first metal conductor, a second metal conductor proximate the first metal conductor and a nitride cap. A first vertically stacked metal structure is provided by vertically aligning each of the first metal conductors of each of the layers with each other, and a second vertically stacked metal structure is provided by vertically aligning each of the second metal conductors of each of the layers with each other. At least one air gap is etched between the first vertically stacked metal structure and the second vertically stacked metal structure.

BRIEF DESCRIPTION OF THE SEVERAL VIEWS OF THE DRAWINGS

The embodiments herein will be better understood from the following detailed description with reference to the drawings, which are not necessarily drawing to scale and in which.

DETAILED DESCRIPTION

Dielectric film cracking poses significant reliability risks for advanced semiconductor fabrication technologies. Film cracking leads to chip reliability failures such as metal wire lifting and corrosion. For example, dielectric film cracking has been observed when very thick metal wires are stacked up on top of each other and vertical crack propagation results in lower level metal wiring lifting during thermal cycle stressing. This problem is particularly serious when intra-wiring spacing is narrow because of the tremendous amount of stress related to disparate coefficient of thermal expansion in materials. The known previous solution is to increase spacing between wires, which reduces stress. Unfortunately, wide metal spacing can lead to significantly large chip size, which is not acceptable to clients.

Figure 1A:
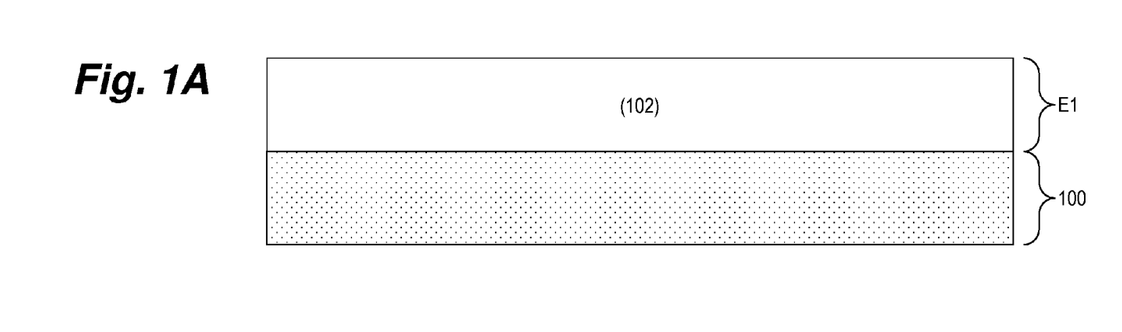
FIG. 1A is a schematic diagram of a semiconductor device.
Figures 1B, 1C:
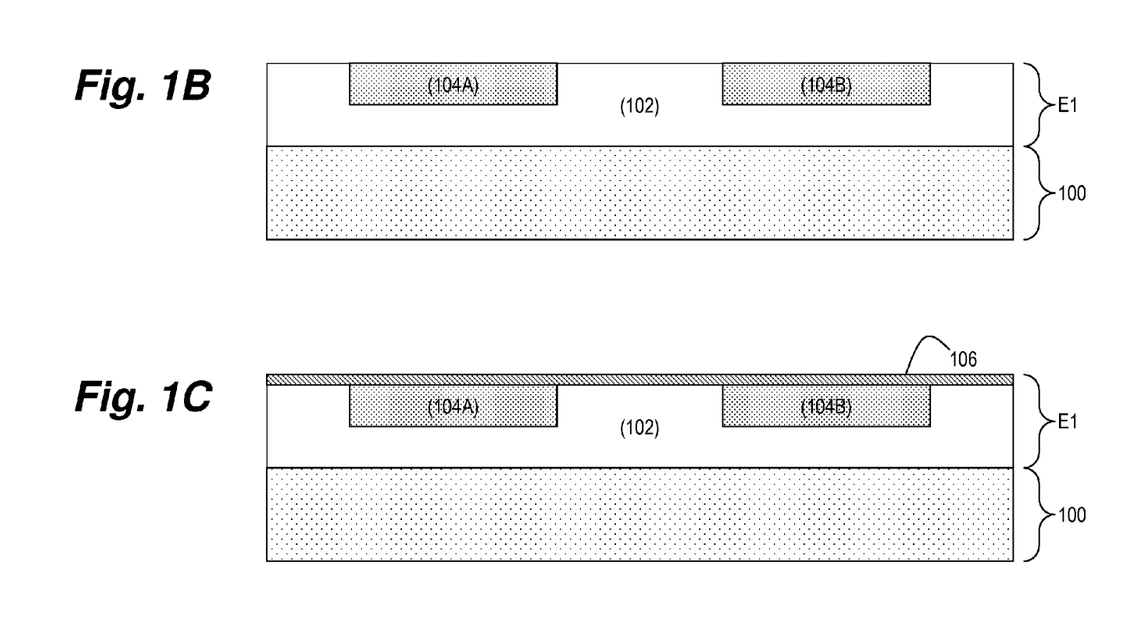
FIG. 1B is a schematic diagram of a semiconductor device.
FIG. 1C is a schematic diagram of a semiconductor device.

With reference to FIG. 1A-1C, a basic metal containing layer used to construct a metal damascene structure is shown. FIG. 1A illustrates a silicon substrate 100 having a layer E1 directly deposited upon the substrate 100 that includes a layer of dielectric 102. FIG. 1B illustrates two metal conductors 104A and 104B that have been potentially simultaneously deposited into the upper surface of the dielectric 102 by means of chemically etching the upper surface of the dielectric layer 102 to form two trenches and then filling the trenches with a metal conductor (104A/B). The metal conductor may be Cu or any other conductive metal or metal alloy suitable for a metal stack damascene build-up. Additionally, metal conductors 104A and 104B may be mechanically or chemically polished to be level with the upper surface of the dielectric 102. FIG. 1C illustrates the final processing of metal layer E1 where a nitride cap 106 seals over the metal conductors 104A/B and the upper surface of the dielectric 102.

Figure 2:
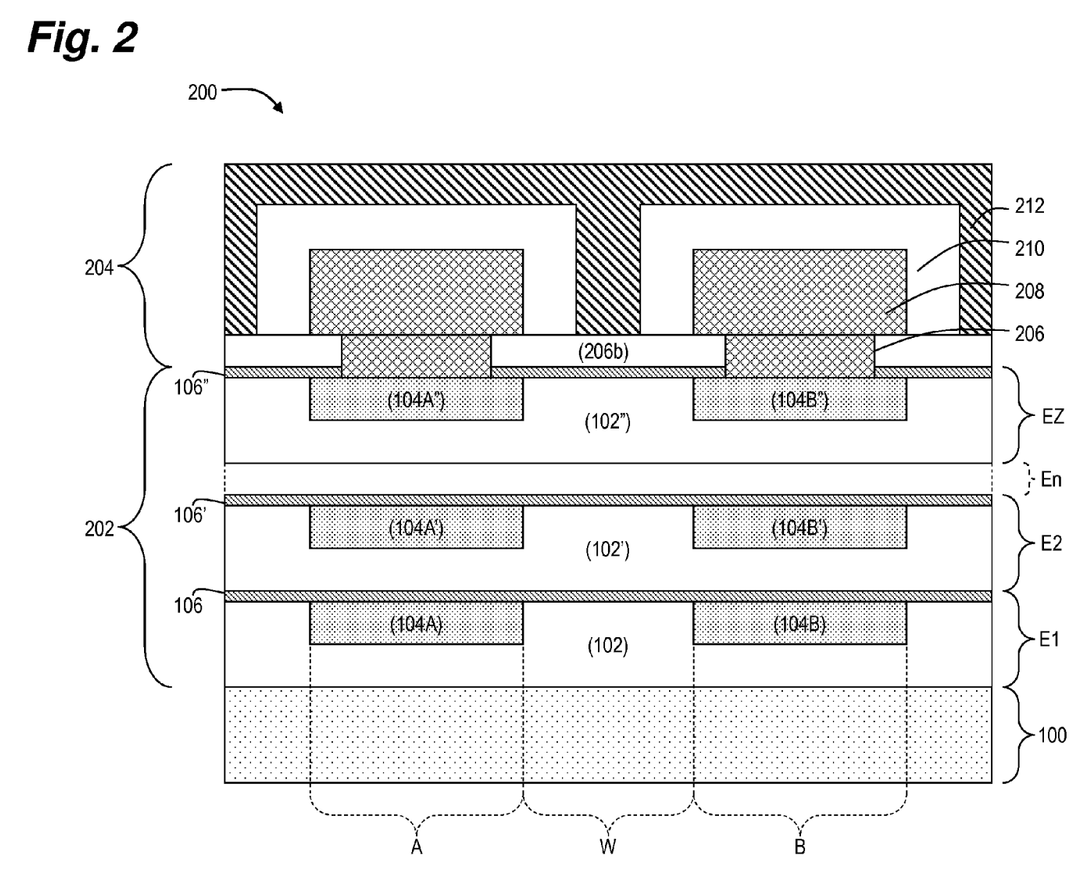
FIG. 2 is a schematic diagram of a semiconductor device.

With reference to FIG. 2, a typical semiconductor device 200 is shown having a metal damascene structure section 202 and an upper semiconductor layer 204 including a metal "VV" layer 206, a dielectric layer 206b, a metal bonding "LD" layer 208, (where layers 206 and 208 may be formed from aluminum), a dielectric 210 and a protective polyamine cap 212.

The metal damascene structure section 202 includes a plurality of metal layers, similar to E1 of FIG. 1C, stacked in a vertical successive pattern as illustrated by layers E2, En, (representing any number of layers E3 to EZ-1), to EZ, the topmost and last layer of the damascene metal layer adjacent the upper semiconductor device 204. Thus, all metal conductors on the left side of the FIG. 2, i.e., 104A, 104A' to 104A" are fabricated in a relative vertically stacked formation, with one metal conductor oriented within the vertical profile A of any metal conductors below and/or above it. Likewise, all metal conductors on the right side of the FIG. 2, i.e., 104B, 104B' to 104B" are fabricated in a relative vertically stacked formation, with one metal conductor oriented within the vertical profile B of any metal conductors below and/or above it. Additionally, a width W separates the metal conductor stacks. The width W can be filled primarily with dielectric material (102, 102', 102") of each layer and of thin layers of the nitride cap of each respective layer (106, 106', 106"). It is this area W between the metal conductor stacks A and B that can accumulate a tremendous amount of stress due to disparate coefficient of thermal expansion in the metal conductors versus the dielectric layers.

Figure 3:
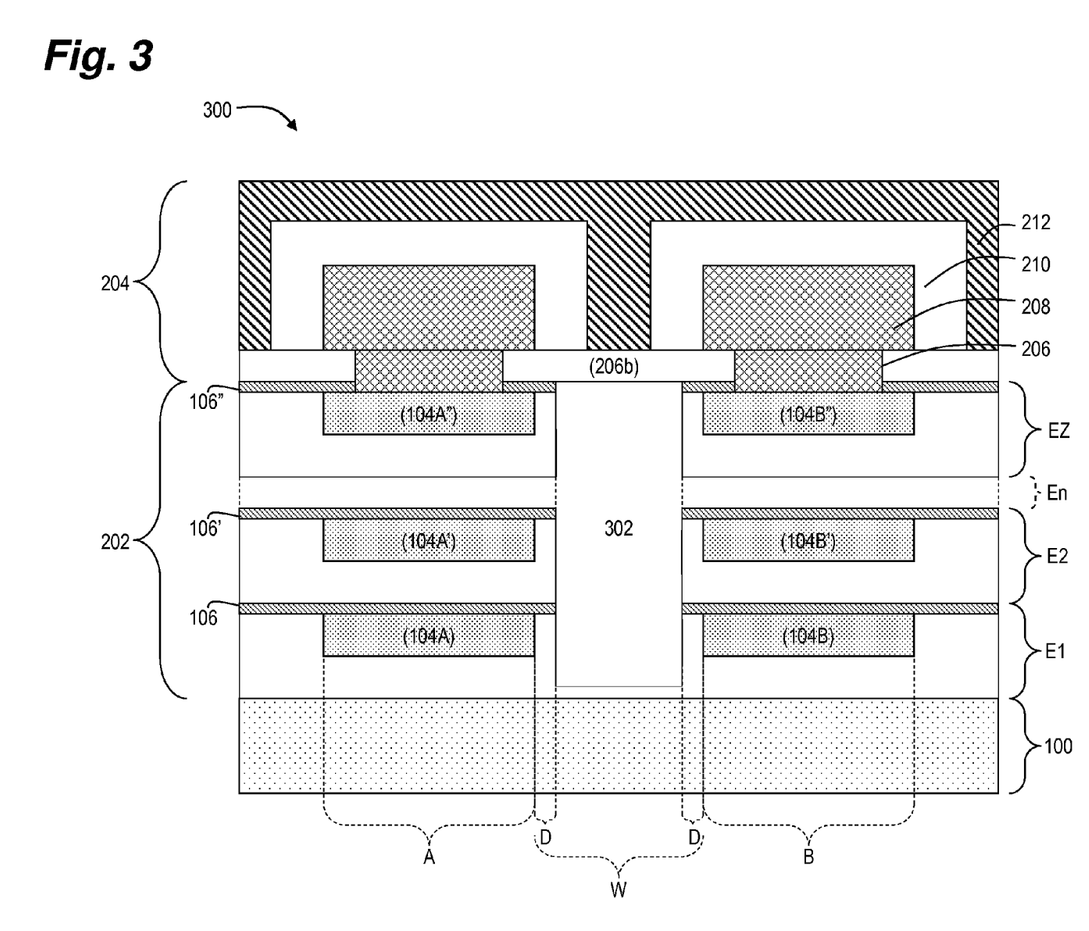
FIG. 3 is a schematic diagram of a semiconductor device according to one embodiment.

With reference to FIG. 3, the semiconductor device 300 illustrates one embodiment of the formation of an air gap 302 in the area W between the metal conductor stacks A and B. In this embodiment, before the upper semiconductor layer 204 is formed, the topmost portion of the upper metal wire layer EZ is masked and the air gap 302 is formed by removing material down to the lowest metal wire layer E1 (using any material removal process such as, for example, etching, chemical removal processes, etc.). The width of the air gap 302 is formed such that the distance between the edges of each respective adjacent metal wire stack and the interior edge of the air gap, denoted by D, is less than a certain measure, such as 50 µm, 25 µm, 10 µm, etc.

Figure 4:
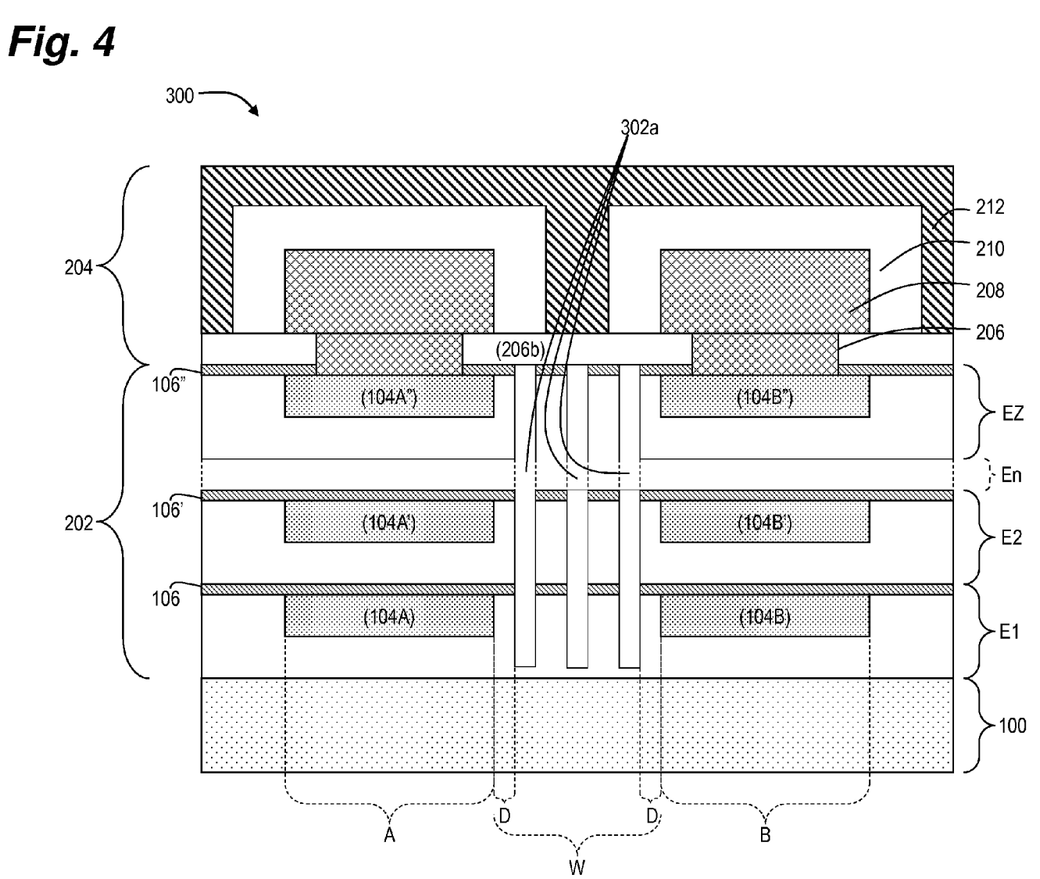
FIG. 4 is a schematic diagram of a semiconductor device according to another embodiment.

With reference to FIG. 4, an alternative embodiment to the embodiment shown in FIG. 3, air-gap 302a may be "pinched-off" by deposition of a non-conformal dielectric, such as SiO$_2$ deposited by plasma-enhanced chemical vapor deposition (PECVD). To enhance the pinch-off at the top of the air-gap, it may be desirable to use a series of narrow air-gaps 302a, (width=0.1 to 5 µm), as shown in FIG. 4, rather than one wide air-gap 302 as shown in FIG. 3.

Figure 10:
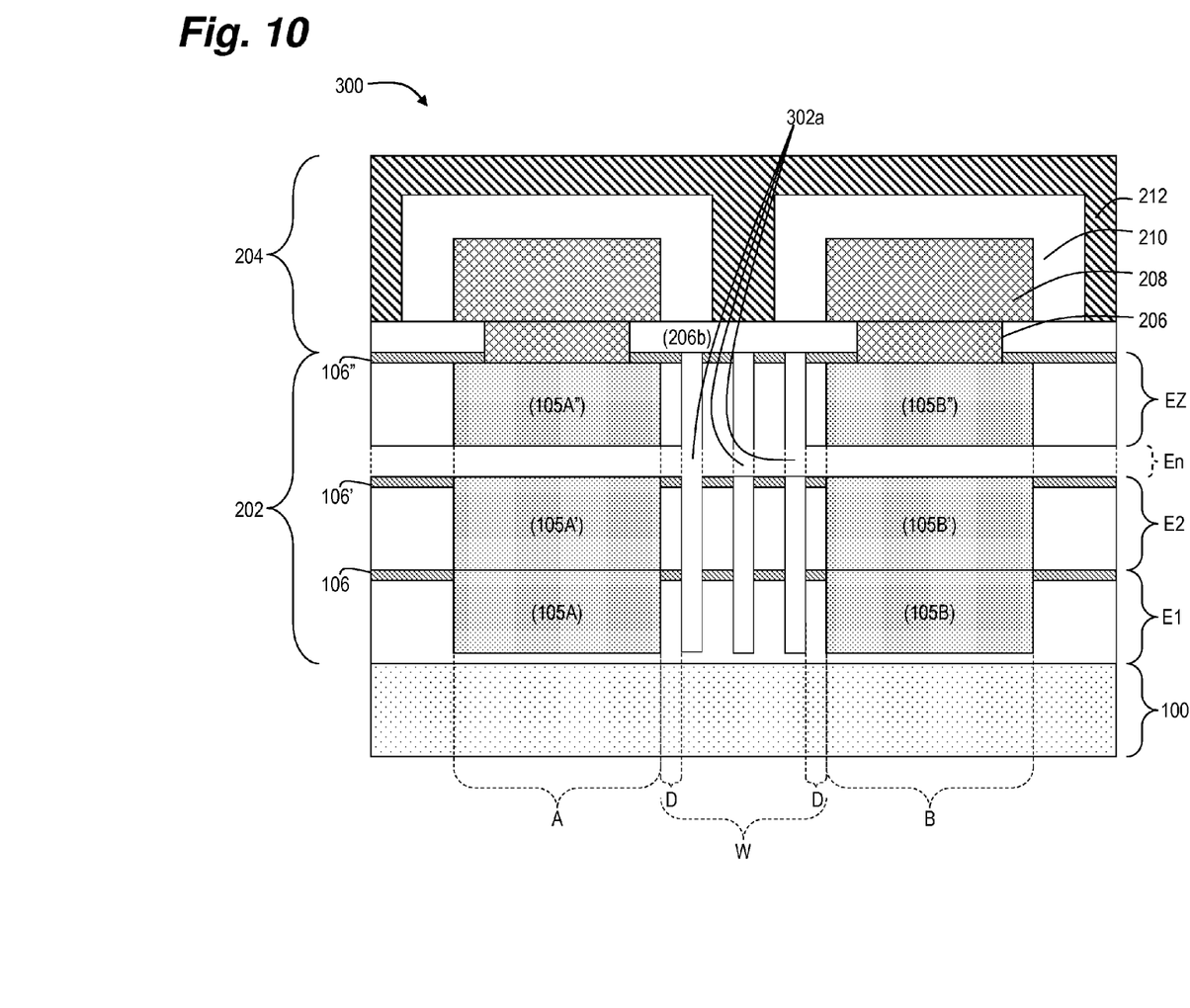
FIG. 10 is a schematic diagram of a semiconductor device according to another embodiment.

FIG. 10 is an alternative embodiment of FIG. 4, where all alternative metal conductors on the left side of FIG. 10, i.e., 105A, 105A' to 105A" are fabricated in a relative vertically stacked formation, with one metal conductor oriented within the vertical profile A of any metal conductors below and/or above it. Likewise, all the alternative metal conductors on the right side of FIG. 10, i.e., 105B, 105B' to 105B" are fabricated in a relative vertically stacked formation, with one metal conductor oriented within the vertical profile B of any metal conductors below and/or above it. The difference from this embodiment is that the metal conductors are touching each other, or are in electrical connection with each other through the thin layers of the nitride cap of each respective layer (106, 106', 106"). Additionally, the metal conductors 105A, 105A' to 105A" and likewise 105B, 105B' to 105B" may have a vertical thickness of greater than 1 µm.

Figure 5:
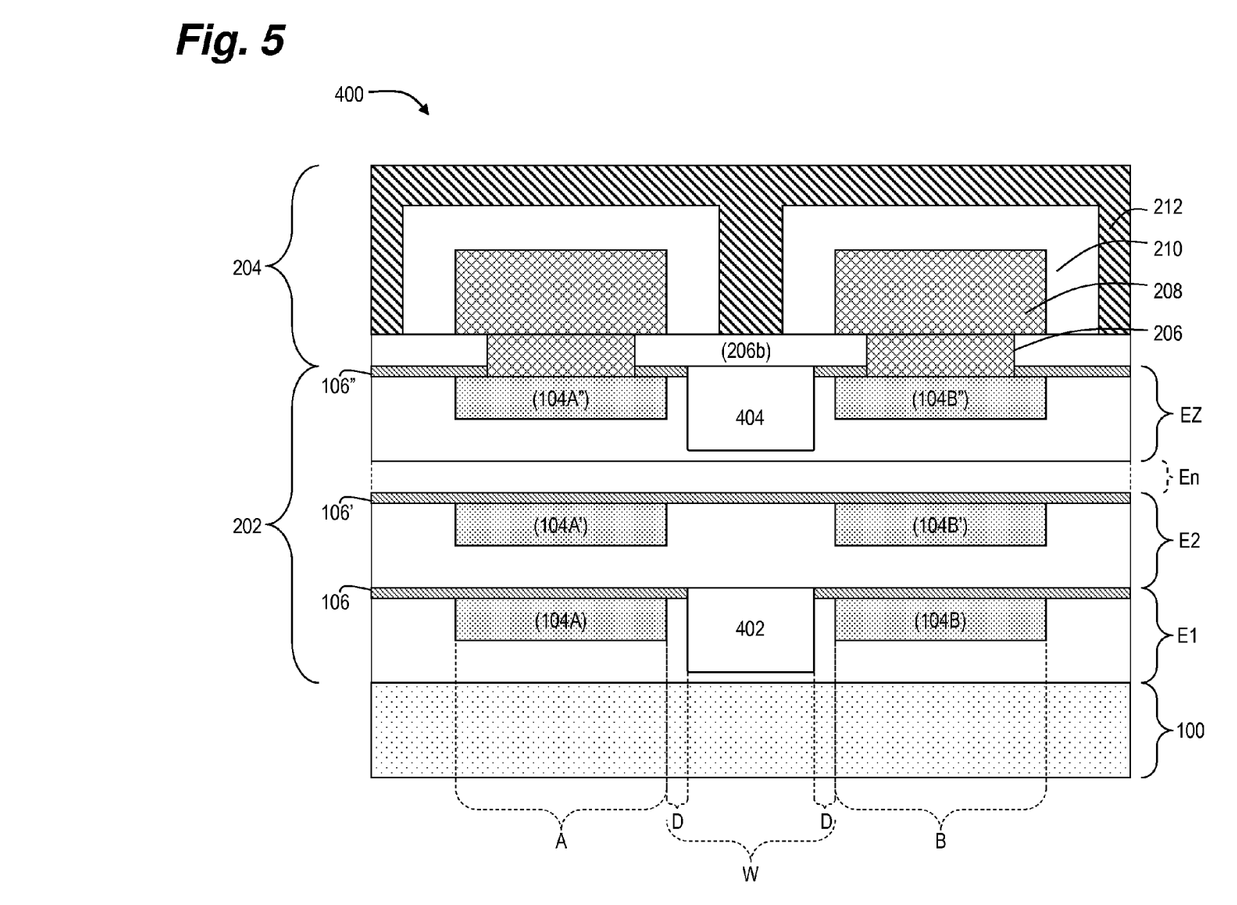
FIG. 5 is a schematic diagram of a semiconductor device according to another embodiment.

With reference to FIG. 5, the semiconductor device 400 illustrates an alternative embodiment that has multiple air gaps in the area W between the metal conductor stacks A and B. In this embodiment, at the end of the formation of the metal wire layer E1, the upper surface of layer E1 is masked and an air gap 402 is formed to substantially penetrate into layer E1 (using any material removal process). Subsequently, additional layers, (E2, En, EZ) are added on top of layer E1, and the upper surface of layer EZ is masked to similarly form a second air gap 404 to substantially penetrate that layer. While only two air gaps are shown, those ordinarily skilled in the art would understand that any number of air gaps could be formed. The upper semiconductor layer 204 is fabricated over the air gap 402/404 combination.

Figure 6:
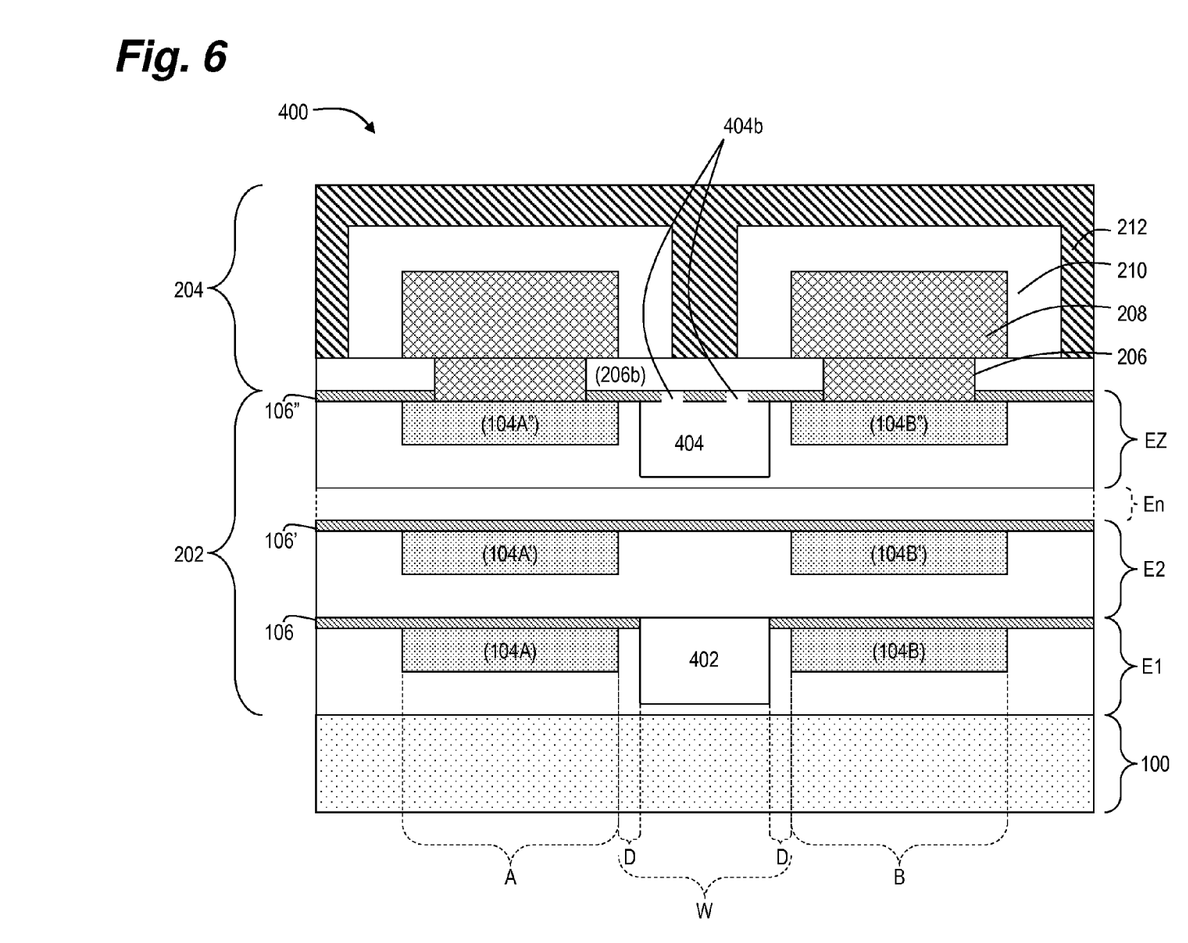
FIG. 6 is a schematic diagram of a semiconductor device according to another embodiment.

With reference to FIG. 6, an alternative embodiment to FIG. 5, a series of narrow openings 404b in the cap layer 106" facilitate "pinching-off" of the air-gap. In this case, narrow openings 404b are formed using lithography and reactive ion etching. Then an isotropic etch, (such as dilute HF wet etch), is used to form a large air gap 404 in the dielectric layer. The small openings 404b can be easily pinched-off by subsequent deposition of a non-conformal dielectric 206b.

Alternatively, any other layer from E2 to EZ may be etched after formation to form any other air gap in a similar manner that may penetrate only that newly formed layer, or to penetrate any number of layers beneath it depending on the design requirements of the semiconductor device to reduce the amount of stress in area W.

Figure 7:
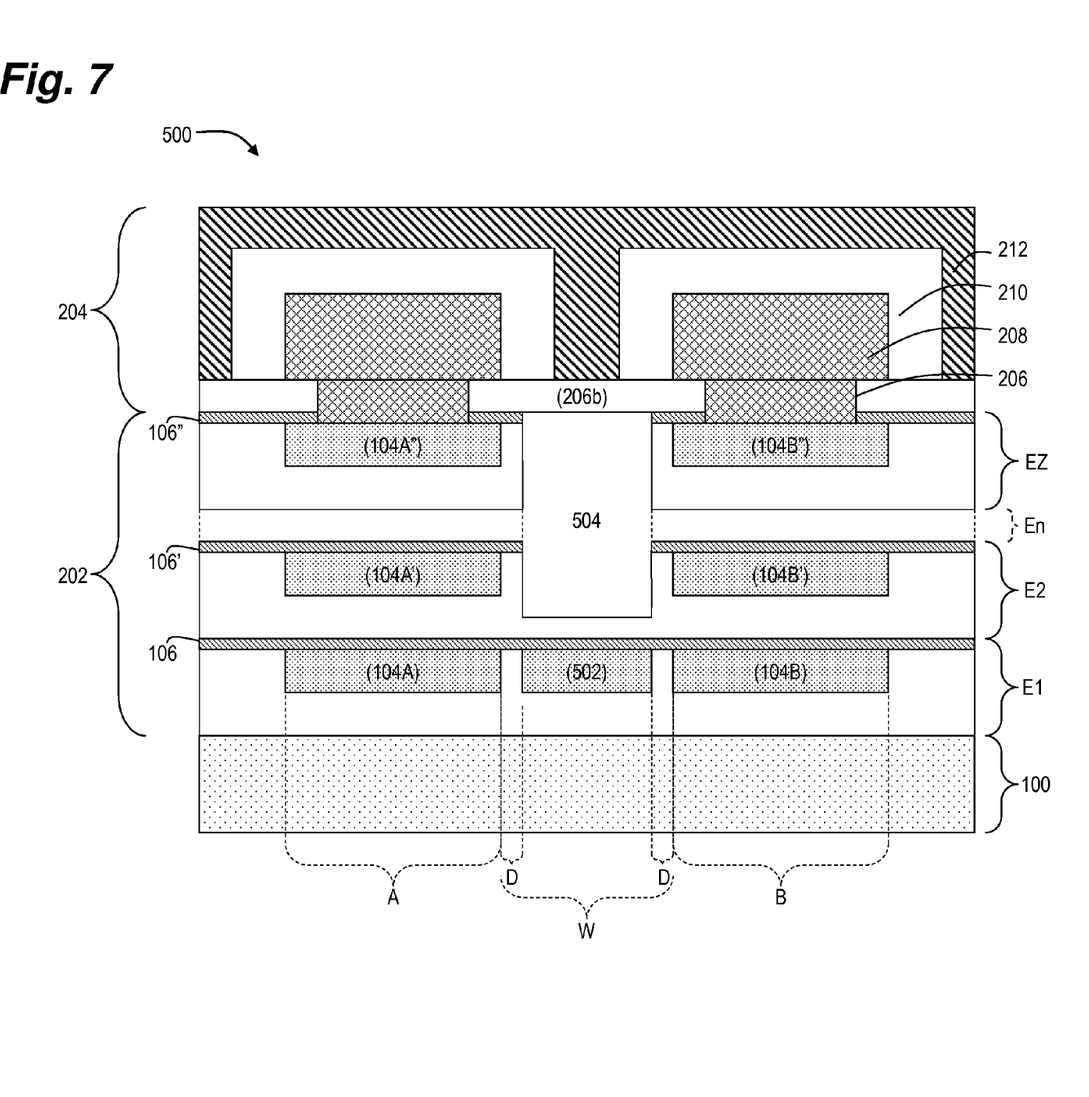
FIG. 7 is a schematic diagram of a semiconductor device according to another embodiment.

With reference to FIG. 7, the semiconductor device 500 illustrates an additional alternative embodiment of the formation of a metal fill 502 in one layer, (in this case layer E1). Metal fill 502 may be fabricated at the same time with metal wires 104A and 104B, and have similar dimensional properties to that of the width of the air gap with respect to the side edges of adjacent metal wire stacks (at A and B), to be less than 10 µm, as denoted by D. Metal fill 502 will relieve stress in the width W area between metal stacks A and B in a similar manner to the air gap since the metal fill 502 has the same thermal coefficient of expansion as the metal conductors 104A and 104B.

Additionally, an air gap 504 may be etched above the metal fill 502 through substantially all of the layers without the metal fill, (i.e., E2, En and EZ), or an air gap may be formed in single layers or multiple layers throughout the metal wire stack layers as shown in FIG. 4 and discussed above. Finally, the upper semiconductor layer 204 is fabricated over the metal fill 502/air gap 504 combination. As would be understood by those ordinarily skilled in the art, any number of such metal fill structures and such air gaps could be formed (potentially alternating air gaps and metal fills) up the structure, layer-by-layer.

Figure 8:
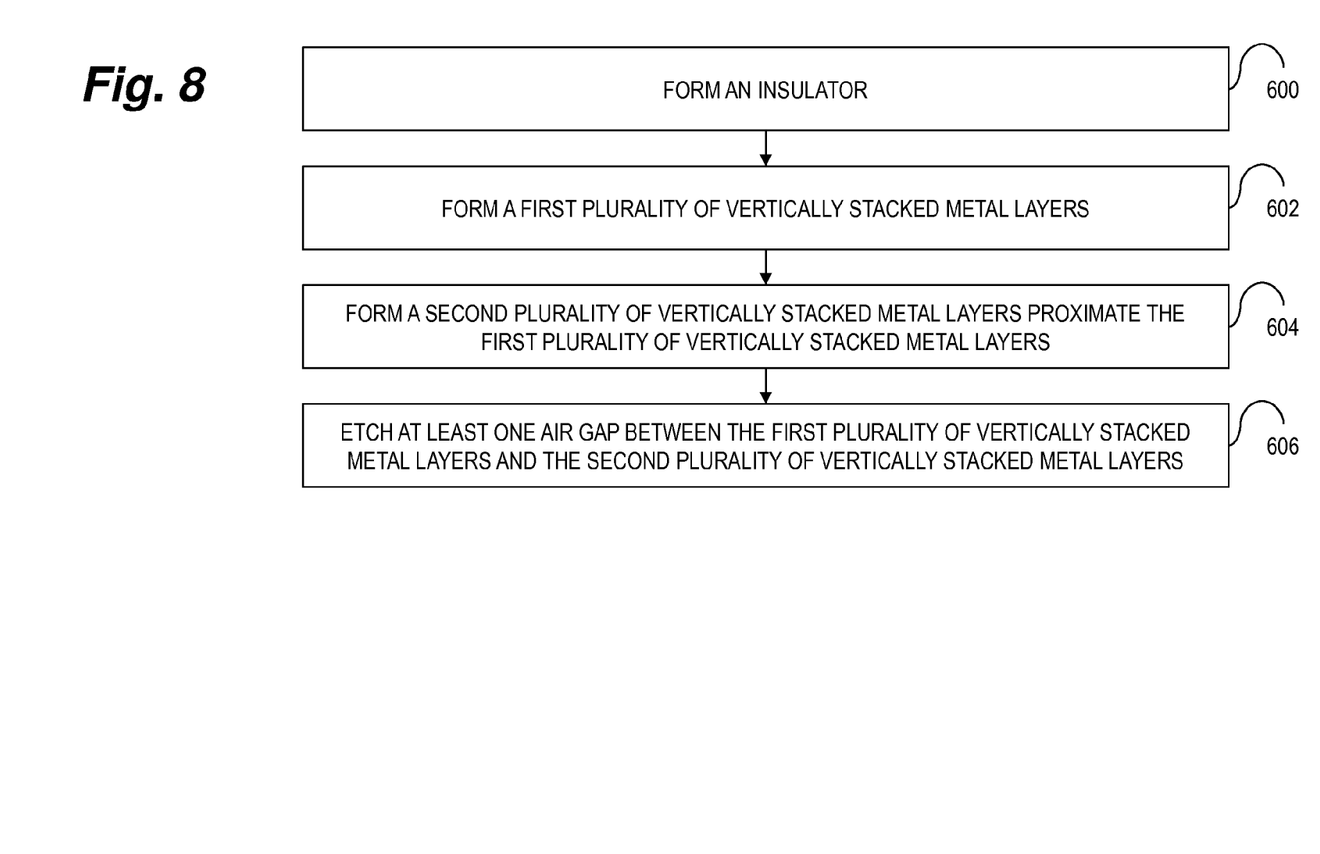
FIG. 8 is a logic flowchart of a method of fabrication according to one embodiment.

With reference to FIG. 8, a method of fabricating a semiconductor device according to one embodiment is shown in a logic flowchart that provides an insulator 600 and provides a first plurality of vertically stacked metal layers 602 and a second plurality of vertically stacked metal layers proximate the first plurality of vertically stacked metal layers 604. Steps 602 and 604 can be performed simultaneously. At least one air gap is then etched between the first plurality of vertically stacked metal layers and the second plurality of vertically stacked metal layers 606.

The air gap(s) and metal fill(s) are positioned less than a certain measure, such as 50 µm, 25 µm, 10 µm, etc. between the first side edge of the first plurality of vertically stacked metal layers and a second side edge of the second plurality of vertically stacked metal layers. As shown above, at least one second air gap may be etched between the first vertically stacked metal layers and the second vertically stacked metal layers. Again, the portion between the first air gap and the second air gap comprises dielectric insulation material. At least one metal fill may be deposited between the first vertically stacked metal layers and the second vertically stacked metal layers. Again, the dielectric insulation material portion between the metal stacks can include at least one metal fill and the at least one air gap.

Additionally, each of the first vertically stacked metal layers may be fabricated by forming a first dielectric insulator, embedding a first metal conductor within the first dielectric insulator, and covering the first metal conductor with a first nitride cap. This process can simultaneously form each of the second plurality of vertically stacked metal layers by simultaneously forming a second dielectric insulator, embedding a second metal conductor within the second dielectric insulator, and covering the second metal conductor with a second nitride cap.

Figure 9:
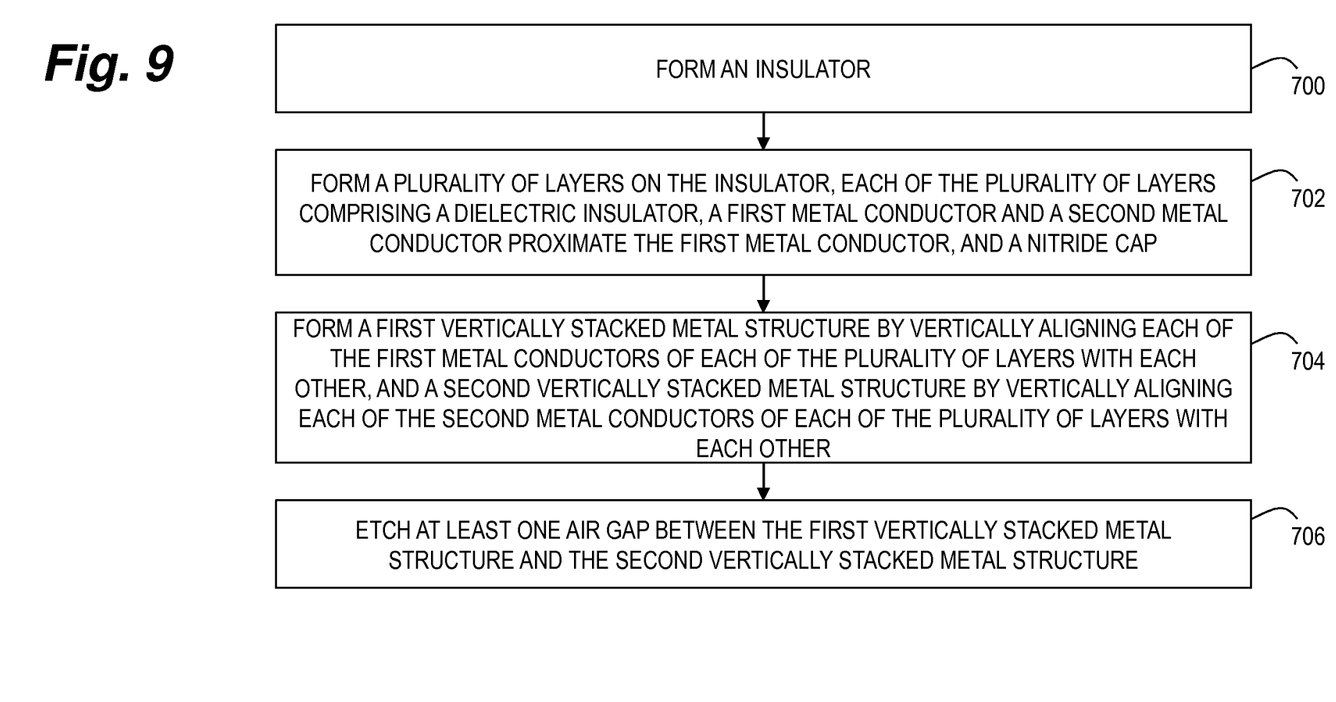
FIG. 9 is another logic flowchart of a method according to another embodiment.

With reference now to FIG. 9 a method of fabricating a semiconductor device according to one embodiment is shown in a logic flowchart that forms an insulator 700. A plurality of layers are formed on the insulator. Each of the plurality of layers comprises a dielectric insulator, a first metal conductor and a second metal conductor proximate the first metal conductor, and a nitride cap 702. A first vertically stacked metal structure is formed by repeating step 702 many times to vertically align each of the first metal conductors of each of the plurality of layers with each other, and vertically align each of the second metal conductors of each of the plurality of layers with each other (to form a second vertically stacked metal structure) 704. At least one air gap is formed between the first vertically stacked metal structure and the second vertically stacked metal structure 706.

The air gap is positioned less than a certain measure, such as 50 µm, 25 µm, 10 µm, etc. between a first side edge of the first vertically stacked metal structure and a second side edge of the second vertically stacked metal structure. Additional air gaps may be etched between the first vertically stacked metal structure and the second vertically stacked metal structure. The portion between the first air gap and the second air gap comprises dielectric insulation material. At least one metal fill can also be deposited to be positioned between the first vertically stacked metal structure and the second vertically stacked metal structure. The portion between the at least one metal fill and the at least one air gap comprises dielectric insulation material.

The method can also embed within the dielectric insulator, the first metal conductor and the second metal conductor, and cover the first metal conductor and the second metal conductor with the first nitride cap.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit the embodiments herein because, as would be understood by those ordinarily skilled in the art, the embodiments are applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprising" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments herein have been presented for purposes of illustration and description, but is not intended to be exhaustive or limited to the invention in the form disclosed. Many modifications and variations will be apparent to those of ordinary skill in the art without departing from the scope and spirit of the embodiments herein. The embodiment was chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
    an insulator; and
    a plurality of vertically stacked layers on said insulator, each of said vertically stacked layers including:
        a first dielectric insulator portion;
        a first conductor within said first dielectric insulator portion;
        a first nitride cap covering said first conductor;
        a second dielectric insulator portion;
        a second conductor within said second dielectric insulator portion; and
        a second nitride cap covering said second conductor,
    said first conductor within said vertically stacked layers forming first vertically stacked conductor layers,
    said second conductor within said vertically stacked layers forming second vertically stacked conductor layers,
    said first vertically stacked conductor layers being proximate said second vertically stacked conductor layers, and
    said vertically stacked layers further comprising an air gap positioned between said first vertically stacked conductor layers and said second vertically stacked conductor layers of said semiconductor device.

2. The semiconductor device according to claim 1, said air gap being positioned less than 10 μm between a first side edge of said first vertically stacked layers and a second side edge of said second vertically stacked layers.

3. The semiconductor device according to claim 1, said air gap comprising a first air gap positioned below a second air gap, and
    a portion of said vertically stacked layers between said first air gap and said second air gap comprising a dielectric insulation material.

4. The semiconductor device according to claim 1, further comprising:
    at least one metal fill positioned between said first conductor within said first dielectric insulator portion and said second conductor within said second dielectric insulator portion,
    a portion of said vertically stacked layers between said metal fill and said air gap comprising dielectric insulation material.

5. The semiconductor device according to claim 1, said first conductor and said second conductor comprising copper.

6. The semiconductor device according to claim 1, said at least one first conductor being in electrical connectivity and directly contacting said second conductor,
    said at least one of said first conductor and said second conductor having a vertical thickness greater than 1 μm.

7. A semiconductor device comprising:
    an insulator;
    a plurality of layers on said insulator, each of said layers including a first conductor and a second conductor positioned proximate said first conductor;
    said first conductor in said layers comprising a first vertically stacked structure, and said second conductor in said layers comprising a second vertically stacked structure; and
    at least one air gap within said layers positioned between a first side edge of said first vertically stacked structure and a second side edge of said second vertically stacked structure.

8. The semiconductor device according to claim 7, said air gap being positioned less than 10 μm between said first vertically stacked structure and said second vertically stacked structure.

9. A semiconductor device comprising:
    an insulator;
    a plurality of layers on said insulator, each of said layers including a first conductor and a second conductor positioned proximate said first conductor;
    said first conductor in said layers comprising a first vertically stacked structure, and said second conductor in said layers comprising a second vertically stacked structure; and
    at least one air gap within said layers positioned between said first vertically stacked structure and said second vertically stacked structure,
    said air gap comprising a first air gap positioned below a second air gap,
    a portion of said layers between said first air gap and said second air gap comprising dielectric insulation material.

10. The semiconductor device according to claim 7, further comprising:
    at least one metal fill positioned between said first vertically stacked structure and said second vertically stacked structure,
    a portion of said layers between said metal fill and said air gap comprising dielectric insulation material.

11. The semiconductor device according to claim 7, said first conductor and said second conductor comprising copper.

12. The semiconductor device according to claim 7, said air gap comprising a first air gap positioned below a second air gap,
    a portion of said layers between said first air gap and said second air gap comprising dielectric insulation material.

13. The semiconductor device according to claim 7, said first conductor being positioned within a first dielectric insulator portion of said layers and said second conductor being positioned within a second dielectric insulator portion of said layers.

14. The semiconductor device according to claim 7, said first conductor being in electrical connectivity and directly contacting said second conductor.

15. The semiconductor device according to claim 7, said first conductor and said second conductor having a vertical thickness greater than 1 μm.

16. The semiconductor device according to claim 9, said air gap being positioned less than 10 μm between a first side edge of said first vertically stacked structure and a second side edge of said second vertically stacked structure.

17. The semiconductor device according to claim 9, further comprising:
    at least one metal fill positioned between said first vertically stacked structure and said second vertically stacked structure,
    a portion of said layers between said metal fill and said air gap comprising dielectric insulation material.

18. The semiconductor device according to claim 9, said first conductor and said second conductor comprising copper.

19. The semiconductor device according to claim 9, said first conductor being positioned within a first dielectric insulator portion of said layers and said second conductor being positioned within a second dielectric insulator portion of said layers.

20. The semiconductor device according to claim 9, said first conductor being in electrical connectivity and directly contacting said second conductor.

21. The semiconductor device according to claim 9, said first conductor and said second conductor having a vertical thickness greater than 1 μm.

* * * * *